(12) United States Patent
Silverman

(10) Patent No.: US 6,972,420 B2
(45) Date of Patent: Dec. 6, 2005

(54) ATOMIC BEAM TO PROTECT A RETICLE

(75) Inventor: Peter J. Silverman, Palo Alto, CA (US)

(73) Assignee: Intel Corporation, Santa Clara, CA (US)

(*) Notice: Subject to any disclaimer, the term of this patent is extended or adjusted under 35 U.S.C. 154(b) by 12 days.

(21) Appl. No.: 10/835,480

(22) Filed: Apr. 28, 2004

(65) Prior Publication Data
US 2005/0242300 A1 Nov. 3, 2005

(51) Int. Cl.[7] .................. G21G 5/00; G01N 23/00
(52) U.S. Cl. .................. 250/492.2; 250/492.1
(58) Field of Search .................. 250/492.1, 492.2

(56) References Cited

U.S. PATENT DOCUMENTS

| 6,204,509 B1 * | 3/2001 | Yahiro et al. ............. 250/491.1 |
| 6,621,090 B2 * | 9/2003 | Simizu .................. 250/492.2 |
| 6,635,402 B2 * | 10/2003 | Yahiro .................. 430/296 |

* cited by examiner

Primary Examiner—John R. Lee
Assistant Examiner—Paul M. Gurzo
(74) Attorney, Agent, or Firm—Michael D. Plimier

(57) ABSTRACT

Embodiments of the invention provide a beam generator to produce an atomic beam that travels across a patterned surface of a reticle. The beam may interact with particles to prevent the particles from contaminating the reticle.

26 Claims, 3 Drawing Sheets

ATOMIC BEAM TO PROTECT A RETICLE

BACKGROUND

Background of the Invention

Lithography is used in the fabrication of semiconductor devices. In lithography, a light sensitive material called a "photoresist" coats a wafer substrate, such as a silicon substrate. The photoresist may be exposed to light reflected from or transmitted through a mask, called a "reticle", to reproduce a pattern from the reticle on the substrate. If the reticle is contaminated, such as by unwanted particles on the surface of the reticle, the pattern of light reflected from the reticle, and thus the pattern formed on the substrate, may not be the desired pattern. This may lead to failures of microelectronic or other devices formed on the substrate.

DETAILED DESCRIPTION

Figure 1:
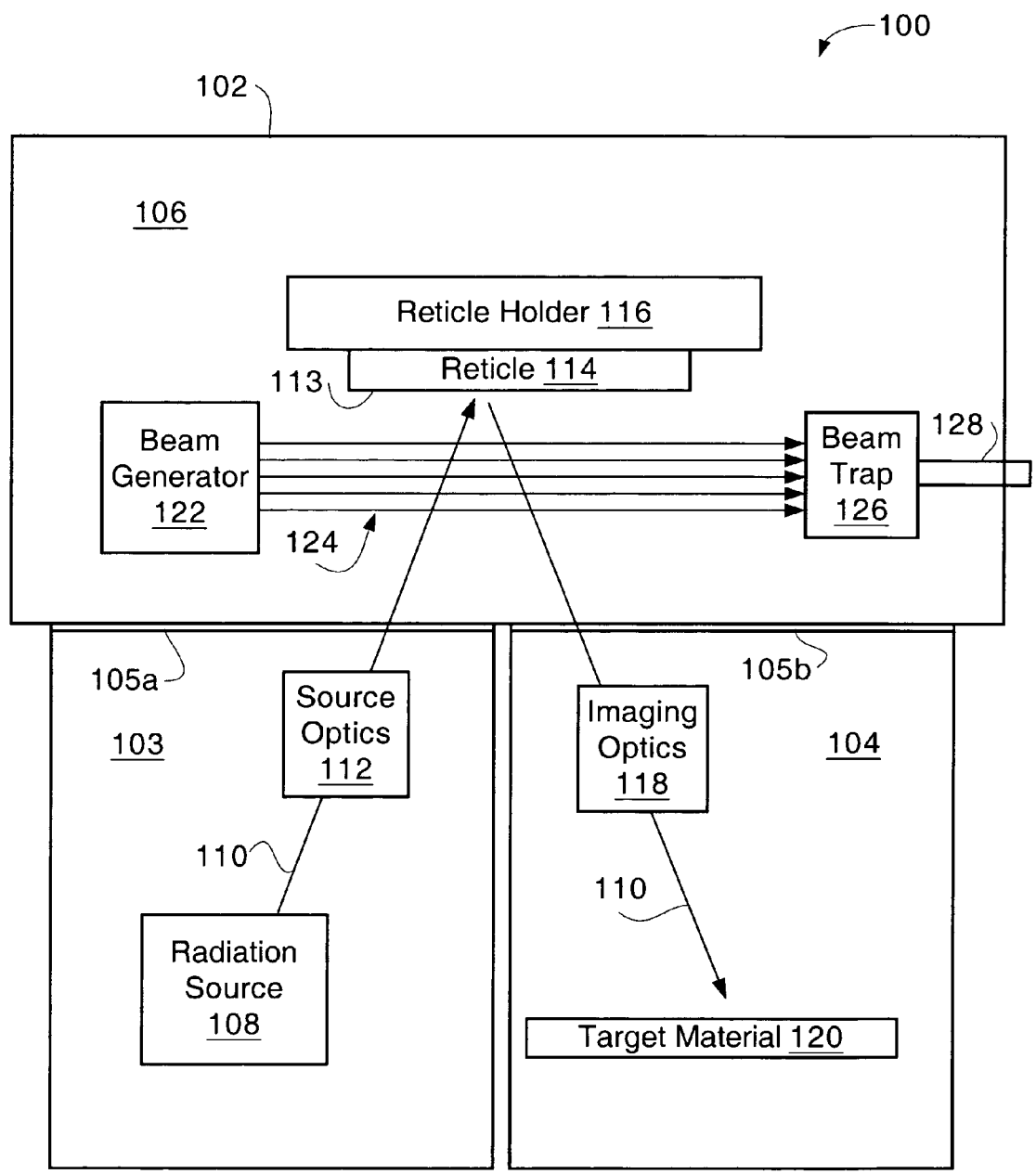
FIG. 1 is a cross sectional schematic of a lithography apparatus according to one embodiment of the present invention.

FIG. 1 is a schematic diagram of a lithography apparatus 100 for patterning a piece of target material 120, such as a silicon substrate, through use of light reflected off a patterned surface of a reticle 114 according to one embodiment of the present invention. The lithography apparatus 100 may include a lithography chamber 102 in which the lithography may take place. In some embodiments, the lithography chamber 102 may be divided into three volumes, a first volume 103, a second volume 104, and a third volume 106.

The first volume 103 may enclose a radiation source 108 and source optics 112, and thus may be referred to as a "source volume" or "source optics volume." The radiation source 108 may be capable of producing electromagnetic radiation 110 used with the reticle 114 to pattern the target material 120. In some embodiments, the radiation source 120 may produce extreme ultraviolet light (EUV), such as light with a wavelength less than about 15 nanometers and greater than that of x-rays (about 1.3 nanometers). The light may have a wavelength of about 13.5 nanometers in some embodiments. In other embodiments, the radiation source 120 may produce different types of radiation or light, with different wavelengths. The source optics 112 may include mirrors or other optical devices for directing the radiation 110 from the radiation source 108 to a patterned surface 113 of the reticle 114.

The second volume 104 may enclose imaging optics 118, and thus may be referred to as an "imaging volume" or "imaging optics volume." The imaging optics 118 may receive radiation 110 reflected from the patterned surface 113 of the reticle 114 and direct the reflected radiation 110 to the target material 120.

The second volume 104 may also enclose the target material 120. The target material 120 may be, for example, a silicon wafer with a coating of a photoresist material. The photoresist material may react in response to the radiation 110 reflected from the reticle 114 to allow patterning of the material of the silicon wafer. Other materials besides a silicon wafer may also be used as the target material 120.

A first separator 105a may separate the first volume 103 from the third volume 106 and a second separator 105b may separate the second volume 104 from the third volume 106 in some embodiments. In an embodiment, one or both of the separators 105a, 105b may include an opening (not shown) so that the first volume 103 and/or second volume 104 is not completely sealed off from the third volume 106. This opening may be useful, for example, when the radiation source 108 produces EUV light. EUV light is blocked by nearly all materials, but openings in the separators 105a, 105b may allow the EUV radiation to travel from the radiation source 108 in the first volume 103 to the patterned surface 113 of the reticle 114 in the third volume 106 and then to the target material 120 in the second volume 104. The opening(s) may be small enough that a pressure differential may be maintained between the first and third volumes 103, 106 and/or between the second and third volumes 104, 106. For example, the first and second volumes 103, 104 may be held at a near vacuum during operation of the lithography apparatus 100 while the third volume 106 may be held at a higher pressure, such as between about 10 and 100 milliTorr. In another embodiment, the separators 105a, 105b may completely seal the first and second volumes 103, 104 from the third volume 106. The radiation 110 produced by the radiation source 108 may have a different wavelength than EUV light and be able to pass through windows in the separators 105a, 105b to travel between the first, second, and third volumes 103, 104, 106. In still another embodiment, the entirety of both separators 105a, 105b may be made of a material transparent to the radiation 110 produced by the radiation source 108.

The third volume 106 may enclose a reticle holder 116. The reticle holder 116 may hold the reticle 114 in a fixed or moveable position during use of the lithography apparatus 100, so that the pattern on the patterned surface 113 of the reticle 114 may be correctly transferred to the target material 120. The reticle holder 116 may move during use, causing the reticle 114 to also move, and allowing the radiation 110 reflect off of the entire patterned surface 113 of the reticle 114. Various embodiments of reticle holders 116 may be used, such as a holder 116 that affixes the reticle 114 in place by electrostatic energy, a holder 116 that affixes the reticle 114 by mechanical devices, a holder 116 beneath the reticle 114 so that gravity keeps the reticle 114 in place, or other reticle holders 116.

The third volume 106 may also enclose the reticle 114. The reticle 114 may be a reflective reticle 114 with a patterned surface 113 off of which the radiation 110 is reflected to pattern the target material 120 in some embodiments. In other embodiments, the reticle 114 may be a transmissive reticle 114, where radiation 110 passes through the reticle 114 to transfer the pattern from the patterned surface 113 to the target material 120 in other embodiments. Any reticle 114 suitable for a lithography apparatus 100 may be used.

The third volume 106 may also enclose a beam generator 122 and a beam trap 126. During operation of the lithography apparatus 100, the beam generator 122 may generate an atomic beam 124 and direct the beam 124 across the patterned surface 113 of the reticle 114. In some embodiments, the atomic beam 124 may be a beam of charged ions or a beam of neutral atoms. The beam 124 may interact with particles within the third volume 106 to prevent the particles from contacting and contaminating the patterned surface 113 of the reticle 114. The beam 124 may cause the particles to travel along the direction of the beam 124. The beam 124 and particles with which the beam 124 has interacted may enter the beam trap 126. The beam trap 126 may trap the charged ions or neutral atoms of the beam 124 and the particles with which the beam 124 has interacted and prevent them from re-entering the third volume 106. A vacuum line 128 or another device may remove the charged ions or neutral atoms of the beam 124 and the particles from the trap 126 and the lithography chamber 102 to prevent them from contaminating the patterned surface 113 of the reticle 114.

The lithography apparatus 100 may be different in different embodiments of the invention. For example, the lithography chamber 102 may not be divided into multiple volumes, or may be divided into more or fewer than three volumes. The various components of the lithography apparatus 100 may be arranged differently. For example, the radiation source 108 may be located in the third volume 106. Various components may be located outside of the lithography chamber 102, rather than enclosed by the chamber 102. For example, the beam generator 122 may be located outside the chamber 102 and direct the beam 124 into the chamber 102. Various other components may be added to the lithography apparatus 100, or the lithography apparatus 100 may lack some of the illustrated and described components in some embodiments.

Figure 2A:
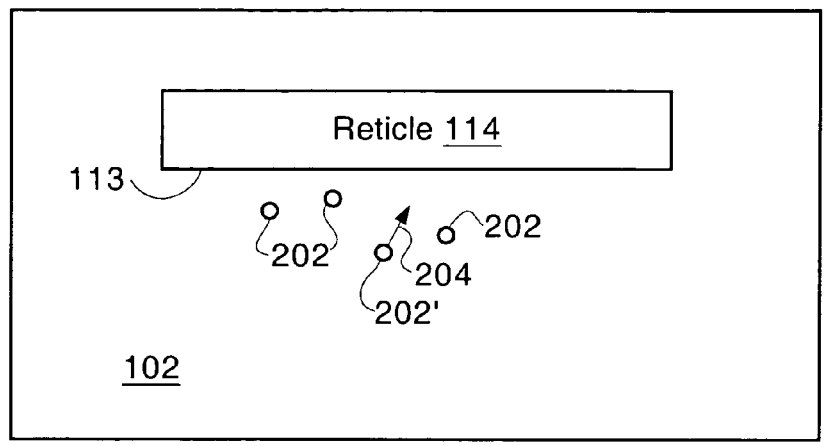
FIG. 2a is a cross sectional schematic of a lithography apparatus that illustrates particles that may contaminate the patterned surface of the reticle.

FIG. 2a is a schematic diagram of a lithography apparatus 100 that illustrates particles 202 that may contaminate the patterned surface 113 of the reticle 114, according to one embodiment of the present invention. There may be many particles 202, such as dust, within the lithography chamber 102. These particles 202 may have a velocity that would result in the particle 202 landing on the patterned surface 113 of the reticle 114. For example, particle 202' of FIG. 2a has a velocity 204 that may result in the particle 202' landing on the patterned surface 113. Should one or more particles 202 land on the patterned surface 113 of the reticle 114 and stay there, contaminating the reticle 114, the pattern from the reticle 114 may be incorrectly transferred to the target material 120. The radiation 110 actually reflected from the reticle 114 would be different from a contaminated reticle 114 than an uncontaminated reticle 114. The particle 202 may prevent the target material 120 from being correctly patterned.

Figure 2B:
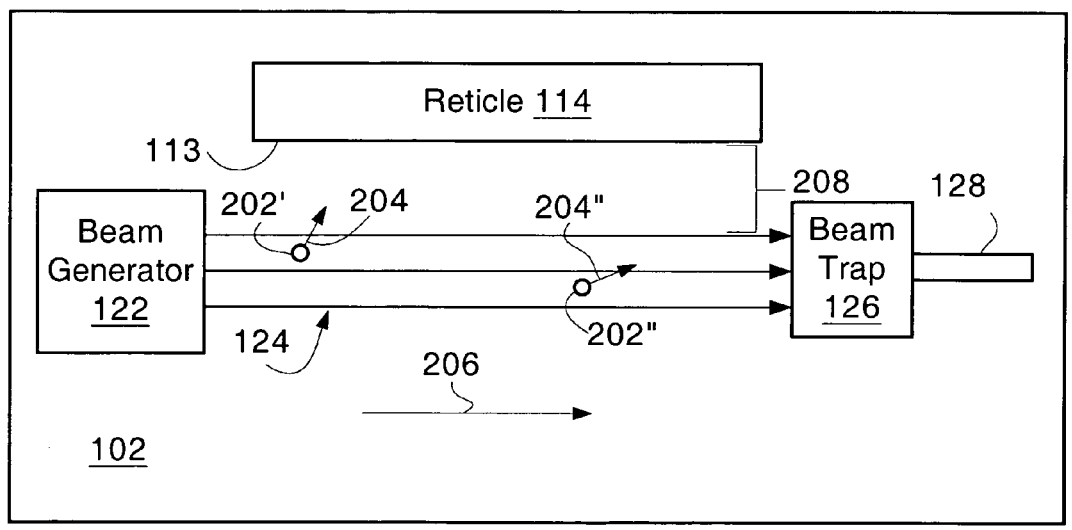
FIG. 2b is a cross sectional schematic of a lithography apparatus that illustrates how the atomic beam may prevent particles from contaminating the reticle.

FIG. 2b is a schematic diagram of a lithography apparatus 100 that illustrates how the atomic beam 124 may prevent particles 202 from contaminating the reticle 114. The beam generator 122 may generate an atomic beam 124. The atomic beam 124 may be a charged ion beam or a neutral atomic beam in some embodiments. In some embodiments, the beam 124 may be an Argon beam, a Xenon beam, another non-reactive beam, or another type of beam. The beam 124 may be substantially collimated. In some embodiments, the beam 124 may travel along a path across the patterned surface 113 of the reticle 114. This path may be substantially parallel to the patterned surface 113 in some embodiments. In other embodiments, the path may be at an angle to the patterned surface 113, with one portion of the beam 124 path closer to the surface 113 than another portion of the beam 124 path. In yet other embodiments, the beam 124 may follow different paths across all or part of the patterned surface 113 of the reticle 114. In some embodiments, all or some of the beam 124 path may be at a distance 208 of about ten centimeters or less from the patterned surface 113. In some embodiments, the pressure in the vicinity of the beam 124 and reticle 114, for example the pressure in the third volume 106 of the lithography apparatus 100 illustrated in FIG. 1, may be higher than a near vacuum. In some embodiments, the pressure may be in a range from about 10 milliTorr to about 100 milliTorr, although other pressures may also be used.

The atomic beam 124 may interact with the particles 202 to prevent the particles 202 from contaminating the reticle 114. The charged ions or neutral atoms of the beam 124 may interact with the particles 202 to cause the particles 202 to travel in the direction of the beam 124. The particles 202 may then enter the beam trap 126 and be removed from the chamber, so the particles 202 may be prevented from contaminating the reticle 114. For example, the illustrated particle 202' of FIG. 2b may initially have a velocity 204 that would cause the particle 202' to land on the and contaminate the reticle 114. The atoms or ions of the atomic beam 124 may interact with the particle 202' and impart momentum to the particle 202' to change the velocity of the particle 202' so that the particle 202' will travel at least partially in a direction 206 of the beam 124 and into the beam trap 126 rather than to the reticle 114 surface 113. For example, the beam 124 has imparted momentum in the direction 206 of the beam 124 to particle 202" of FIG. 2b to change the velocity 204" of the particle 202" from a velocity that would result in the particle contaminating the reticle 114 to a velocity 204" that will result in the particle 204" entering the beam trap 126 and being removed from the lithography chamber 102. In some embodiments the beam 124 may have an energy in a range from about 1 keV to about 100 keV, although in other embodiments the beam 124 may have different energies. In some embodiments, the energy of the beam 124 may be high enough to cause a desired amount of particles 202 to go into the beam trap 126 rather than contaminate the reticle 114 surface.

Figure 3:
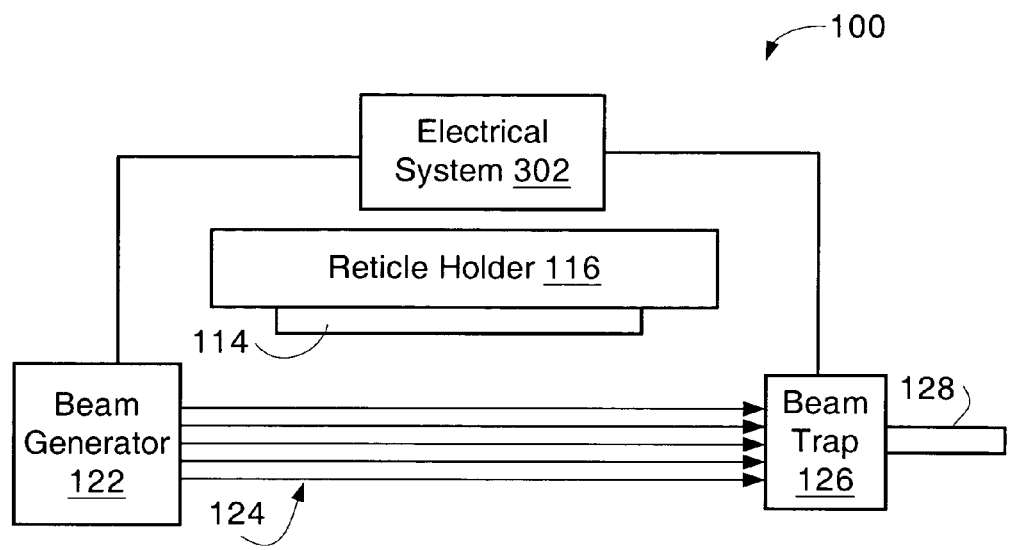
FIG. 3 is a cross sectional schematic that illustrates an alternative embodiment of the lithography apparatus.

FIG. 3 is a schematic diagram that illustrates an alternative embodiment of the lithography apparatus 100. For simplicity and clarity, numerous components that may be included in the lithography apparatus 100 have been omitted from FIG. 3. In the embodiment of the lithography apparatus 100 illustrated in FIG. 3, an electrical system 302 creates a voltage differential between the beam generator 122 and the beam trap 126. This voltage differential may provide further force causing the atoms or ions of the atomic beam 124 to travel from the beam generator 122 into the beam trap 126.

Figure 4:
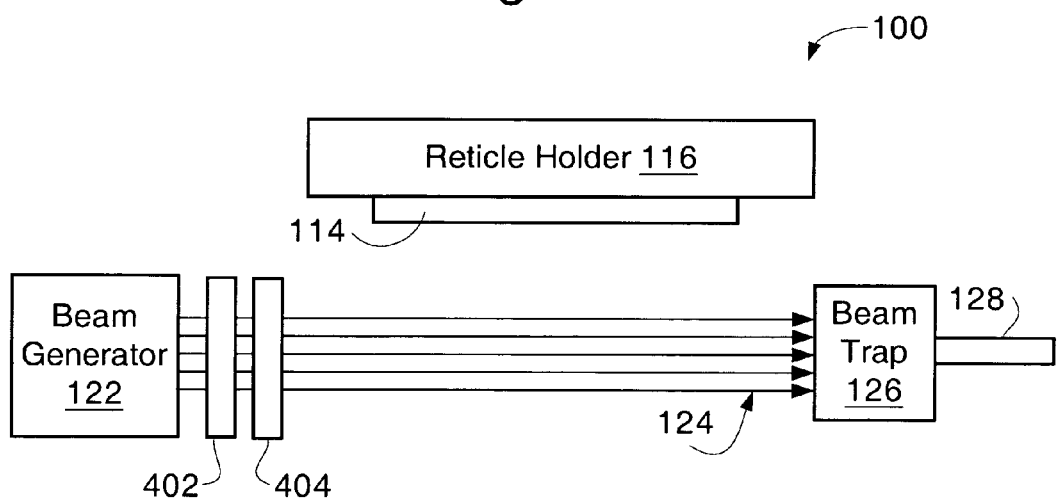
FIG. 4 is a cross sectional schematic that illustrates another alternative embodiment of the lithography apparatus.

FIG. 4 is a schematic diagram that illustrates another alternative embodiment of the lithography apparatus 100. For simplicity and clarity, numerous components that may be included in the lithography apparatus 100 have been omitted from FIG. 4. In the embodiment of the lithography apparatus 100 illustrated in FIG. 4, a collimator 402 collimates the beam 124 generated by the beam generator 122. In some embodiments, the beam generator 122 generates a charged atomic beam 124. A neutralizer 404 removes the charge from the beam 124 so that the beam that passes across the patterned surface 113 of the reticle 114 is a neutral beam 124. Either or both of the collimator 402 and the neutralizer 404 may be included in some embodiments of the lithography apparatus 100. Either or both of the collimator 402 and the neutralizer 404 may be part of the beam generator 122 or another component. Alternatively, either or both of the collimator 402 and the neutralizer 404 may be a separate component of the lithography apparatus 102 in some embodiments.

The foregoing description of the embodiments of the invention has been presented for the purposes of illustration and description. It is not intended to be exhaustive or to limit the invention to the precise forms disclosed. This description and the claims following include terms, such as left, right, top, bottom, over, under, upper, lower, first, second, etc. that are used for descriptive purposes only and are not to be construed as limiting. The embodiments of a device or article described herein can be manufactured, used, or shipped in a number of positions and orientations. Persons skilled in the relevant art can appreciate that many modifications and variations are possible in light of the above teaching. Persons skilled in the art will recognize various equivalent combinations and substitutions for various components shown in the Figures. It is therefore intended that the scope of the invention be limited not by this detailed description, but rather by the claims appended hereto.

I claim:

1. A device, comprising:
a beam generator to produce an atomic beam directed across a patterned surface of a reticle;
an ion trap to trap at least some of the beam after the beam travels across the reticle; and
wherein substantially none of the beam contacts the reticle.

2. The device of claim 1, wherein the atomic beam is produced to interact with particles to prevent the particles from contaminating the patterned surface of the reticle.

3. The device of claim 1, wherein the beam generator produces at least one of an Argon ion beam or a Xenon ion beam.

4. The device of claim 1, wherein the beam generator is to produce an atomic beam with an energy in a range of about 1 keV to about 100 keV.

5. The device of claim 1, wherein the beam generator is to produce an atomic beam that is substantially parallel with the patterned surface of the reticle.

6. The device of claim 5, wherein the atomic beam travels across the patterned surface of the reticle along a path, at least a portion of the path being within a distance of about 10 centimeters or less from the patterned surface of the reticle.

7. The device of claim 1, wherein the atomic beam comprises charged ions.

8. The device of claim 1, wherein the atomic beam comprises neutral atoms.

9. The device of claim 8, further comprising a neutralizer to neutralize ions generated by the beam generator.

10. The device of claim 1, further comprising:
a photolithography chamber including:
a first volume to contain a piece of target material to be patterned by electromagnetic radiation reflected from the reticle, the first volume to be at a first pressure during patterning of the target material; and
a second volume to contain the reticle, the second volume to be at a second pressure higher than the first pressure during patterning of the target material; and
a vacuum line connected to the ion trap to remove particles from the photolithography chamber.

11. The device of claim 10, wherein the beam generator and the ion trap are within the photolithography chamber.

12. The device of claim 10, further comprising:
a source of extreme ultraviolet radiation;
source optics to receive the extreme ultraviolet radiation from the source and to direct the received extreme ultraviolet radiation to the patterned surface of the reticle; and
imaging optics to receive extreme ultraviolet radiation reflected from the patterned surface of the reticle to a piece of target material, wherein the extreme ultraviolet radiation from the imaging optics interacts with at least a portion of the target material to pattern the target material.

13. The device of claim 10, wherein the second pressure is in a range from about 10 millitorr to about 100 milliTorr.

14. The device of claim 1, further comprising an electrical system to provide a voltage differential between the beam generator and the ion trap.

15. A device, comprising:
a photolithography chamber;
a reticle holder in the photolithography chamber to hold a reticle with a patterned surface;
a source to generate an atomic beam and direct the beam across at least a portion of the photolithography chamber in a path that does not intersect surfaces of the reticle; and
a trap to remove atoms of the atomic beam from the photolithography chamber.

16. The device of claim 15, wherein the atoms of the atomic beam interact with particles in the photolithography chamber and cause the particles to travel in a direction toward the trap to prevent the particles from contaminating the patterned surface of the reticle.

17. The device of claim 15, wherein the atoms of the atomic beam get within a distance of about 10 centimeters or less of the patterned surface of the reticle.

18. The device of claim 15, wherein the photolithography chamber is adapted to have a pressure adjacent the reticle in a range from about 10 milliTorr to about 100 milliTorr during use.

19. The device of claim 15, wherein the atoms of the atomic beam have an energy in a range of about 1 keV to about 100 keV.

20. The device of claim 15, wherein the atoms of the atomic beam comprise charged ions.

21. The device of claim 15, wherein the atoms of the atomic beam comprise neutral atoms.

22. A method, comprising:
generating an atomic beam;
directing the atomic bean across a patterned surface of a reticle disposed in a photolithography chamber wherein substantially none of the beam contacts the patterned surface of the reticle;
trapping the atomic beam and a plurality of particles; and
removing the particles from the photolithography chamber.

23. The method of claim 22, wherein the atomic beam has an energy in a range of about 1 keV to about 100 keV.

24. The method of claim 22, further comprising reducing a pressure of a portion of the photolithography adjacent the reticle to a range from about 10 milliTorr to about 100 milliTorr.

25. The method of claim 22, further comprising collimating the atomic beam.

26. The method of claim 22, wherein the atomic beam comprises at least one of charged ions or neutral atoms.

* * * * *